United States Patent [19]

Hamamura et al.

[11] Patent Number: 5,078,820

[45] Date of Patent: Jan. 7, 1992

[54] METHOD AND APPARATUS FOR PRESSURE STICKING A THIN FILM TO A BASE PLATE

[75] Inventors: Fumio Hamamura, Kanagawa; Yukio Oka, Yamaguchi, both of Japan

[73] Assignees: Somar Corporation; Hitachi Techno, both of Tokyo, Japan

[21] Appl. No.: 328,402

[22] Filed: Mar. 24, 1989

[30] Foreign Application Priority Data

Mar. 25, 1988 [JP] Japan .................................. 63-72959
Mar. 25, 1988 [JP] Japan .................................. 63-72960

[51] Int. Cl.$^5$ ......................... B32B 31/00; B30B 5/02; B65B 21/02
[52] U.S. Cl. ................................. 156/267; 156/285; 156/286; 156/301; 156/382; 156/552; 156/583.3; 100/211; 414/331; 414/417
[58] Field of Search ...................... 156/382, 583.3, 285, 156/286, 212, 87, 381, 312, 382, 301, 552, 295, 267; 414/797.9, 331, 417; 226/164; 100/211; 264/DIG. 50

[56] References Cited

U.S. PATENT DOCUMENTS

| | | | |
|---|---|---|---|
| 1,206,656 | 11/1916 | Benedictus ............. | 264/DIG. 50 X |
| 3,322,598 | 5/1967 | Marks et al. . | |
| 3,329,549 | 7/1967 | Vilutis .................... | 156/286 |
| 3,658,629 | 4/1972 | Cramer et al. ......... | 156/552 |
| 3,860,473 | 1/1975 | Wesen .................... | 156/267 |
| 3,870,582 | 3/1975 | Brackett et al. . | |
| 4,127,436 | 11/1978 | Friel ....................... | 156/285 X |
| 4,152,188 | 5/1979 | Friedrich et al. ...... | 156/285 |
| 4,314,814 | 2/1982 | Deroode ................ | 156/286 |
| 4,316,757 | 2/1982 | Walsh .................... | 156/286 |
| 4,338,152 | 7/1982 | Del Bianco et al. .. | 226/162 X |
| 4,373,846 | 2/1983 | Charbonnet ........... | 414/417 |
| 4,432,828 | 2/1984 | Siempelkamp et al. | 156/382 |
| 4,511,425 | 4/1985 | Boyd et al. ............. | 156/583.3 |
| 4,544,619 | 10/1985 | Christensen et al. .. | 430/271 X |
| 4,564,408 | 1/1986 | Crumbach et al. .... | 156/212 |
| 4,680,079 | 7/1987 | Tanaka ................... | 156/552 |
| 4,707,208 | 11/1987 | Crumbach et al. .... | 156/212 X |
| 4,834,821 | 5/1989 | Maligie . | |

FOREIGN PATENT DOCUMENTS

| | | |
|---|---|---|
| 0161125 | 11/1985 | European Pat. Off. . |
| 0215358 | 3/1987 | European Pat. Off. . |
| 0324596 | 7/1989 | European Pat. Off. . |
| 2287714 | 5/1976 | France . |
| 62-117389 | 5/1987 | Japan .................................. 156/312 |

*Primary Examiner*—David A. Simmons
*Assistant Examiner*—Chester T. Barry
*Attorney, Agent, or Firm*—Sughrue, Mion, Zinn, Macpeak & Seas

[57] ABSTRACT

Apparatus and method for pressure and heat sticking a thin film to a base plate. The thin film and a base plate on a film like carrier are introduced into a vacuum chamber having upper and lower contact members for compressing the thin film, base member and carrier into a stratified body. The thin film and base plate are held separate from one another in the chamber. The lower contact member moves upward to contact the carrier and base plate and to compress the stratified body between it and the upper contact member. The upper contact member is convex in shape and made of an elastic material so that the contact pressure on the thin film and base plate starts near the center and spreads toward the periphery resulting in improved sticking of thin film to the base plate with no air bubbles and no wrinkling. The pressure is applied in a vacuum or reduced atmospheric pressure and heat is simultaneously applied. A further compression in the air at atmospheric pressure is carried out by a heat and pressure roller.

18 Claims, 5 Drawing Sheets

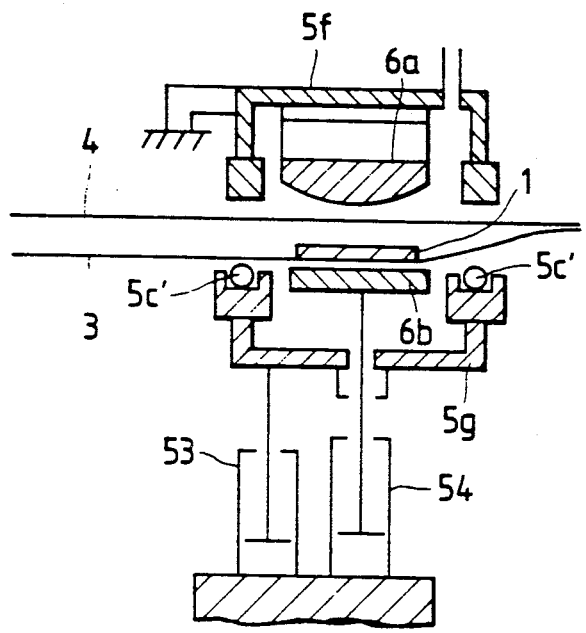
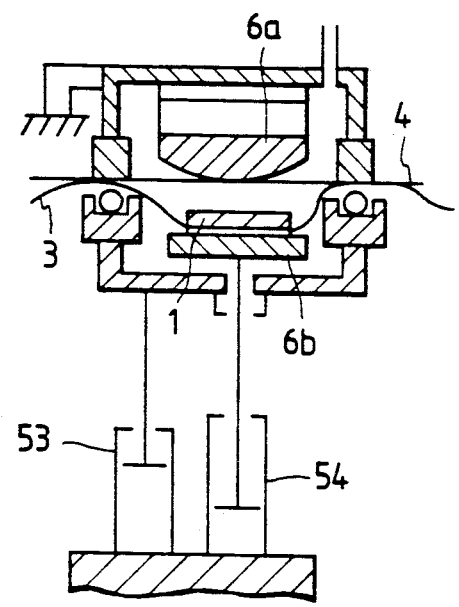
FIG. 8A
FIG. 8B
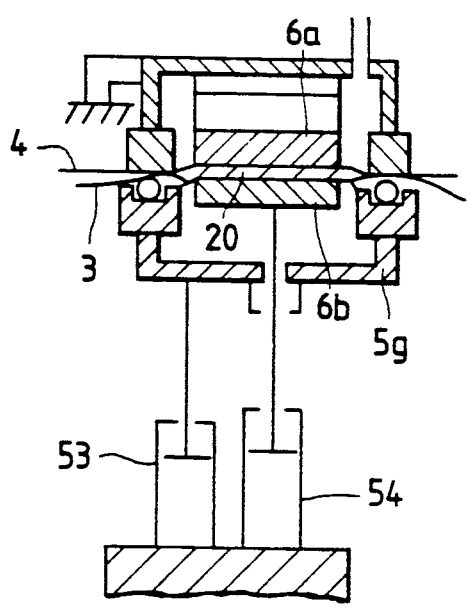
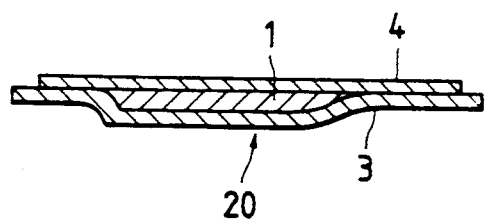
FIG. 8C
FIG. 9

METHOD AND APPARATUS FOR PRESSURE STICKING A THIN FILM TO A BASE PLATE

BACKGROUND OF THE INVENTION

1. Field of the Invention

The present invention relates to the art of adhering a thin film to a base plate, and particularly relates to the art in which a dry film consisting of a light-transmissible resin film and a photosensitive resin layer provided on one side of the resin film is stuck under pressure to a base plate such as a printed circuit board and an electronic circuit substrate of silicon, gallium arsenide or the like without leaving an air bubble between the dry film and the base plate and without wrinkling the dry film.

2. Description of the Prior Art

In one conventional apparatus for adhering a dry film to a base plate under pressure, as disclosed in Japanese Patent Publication No. 13341/80, the base plate and a photosensitive resin layer bonded to one side of a light-transmissible resin film are brought into contact with each other while being kept in a vacuum chamber of reduced pressure. Sufficient pressure is thereafter applied to the other side of the resin film to push the film and the layer onto the base plate. Thereafter, heat is applied. In another conventional apparatus the dry film is pressed onto the base plate in the air at atmospheric pressure by a rotating heat and pressure sticking roller. In yet another conventional apparatus as disclosed in the Japanese Patent Application (OPI) No. 121696/83, the end of the base plate and that of the dry film are stuck to each other in the air at atmospheric pressure and the film and the plate are thereafter completely stuck to each other in a vacuum. The dry film consisting of a light-transmissible resin film and a photosensitive resin layer bonded to one side of the film is thus stuck to the base plate, under prescribed pressure and at a prescribed temperature in each of the conventional apparatuses. The photosensitive resin layer is thereafter exposed to light through a pattern mask overlaid on the light-transmissible resin film. The resin film is then removed. The resin layer is then etched so that a desired pattern is made on the base plate.

In the above-mentioned conventional arts, however, an air bubble is likely to be left between the dry film and the base plate at the time the film and the plate are stuck to each other. The air bubble causes defects in the step of exposing the film and layer to light or the step of etching the resin layer, thereby causing problems for the process. If the dry film is entirely or partly stuck to the base plate in air at atmospheric pressure, not only will air bubbles likely be left between the dry film and the base plate but also the film will likely be wrinkled by the pressure of the rotating pressure sticking roller. This is another problem.

SUMMARY OF THE INVENTION

The present invention was made in order to solve the above-mentioned problems.

Accordingly, it is an object of the present invention to provide a method and apparatus in which a thin film is stuck to a base plate without leaving an air bubble between the film and the plate and without wrinkling the film.

Other objects and novel features of the present invention will be apparent from the description herein and the drawings attached hereto.

Means for Solving the Problems

In a thin film sticking method in accordance with the present invention, there is provided a pressure sticking means for sticking a conveyed thin film to a base plate, under pressure, in the environment of a vacuum or reduced pressure so as to form a stratified body. A significant feature of the thin film sticking method is that the thin film and the base plate are held at a prescribed distance from each other in the middle portion of a vacuum chamber in which the environment of a vacuum or reduced pressure can be generated. The thin film is placed between an upper contact member and a lower contact member. The upper contact member is made of an elastic material and provided in the upper portion of the vacuum chamber and is shaped such that its central portion is thicker than its peripheral portion thereof. The lower contact member is made of a material of higher rigidity than those of the base plate and the upper contact member, is vertically movably supported in the lower portion of the vacuum chamber, and has a flat shape. The vacuum chamber is degassed so that a vacuum or reduced pressure is generated therein. The lower contact member is moved up in that environment to push up the base plate placed in the middle of the vacuum chamber The lower contact member is moved up further to push the thin film into pressure contact with the upper contact member by the top of the base plate to stick the thin film and the base plate to each other under pressure at a prescribed temperature. The thin film and the base plate are thereafter further stuck to each other in the air at atmospheric pressure by a heat and pressure roller.

A thin film sticking apparatus provided in accordance with the present invention includes a pressure sticking means by which a conveyed thin film is stuck to a base plate under pressure in a vacuum or at reduced pressure so as to form a stratified body. One significant feature of the apparatus is that the apparatus comprises an upper contact member which is shaped semicylindrically or hemispherically to have a larger thickness in the central portion thereof than in the peripheral portion with the convex surface thereof projecting downward and is attached to the bottom of an elastic support member in a vacuum chamber in which a vacuum or reduced pressure can be generated. A lower contact member, which is made of a material of greater hardness than the upper contact member and has a flat shape can be moved up and down. Means are provided for holding the thin film and the base plate at a prescribed distance from each other between the upper and the lower contact members. Means are also provided for degassing the vacuum chamber to generate a vacuum or reduced pressure therein. Further means are provided for moving up the lower contact member to pinch the thin film between the upper and lower contact members by a prescribed force to stick the thin film and the base plate to each other under pressure. A heat and pressure sticking roller is also provided for sticking the thin film and the base plate to each other under pressure further in the air at atmospheric pressure.

Since the thin film and the base plate are stuck to each other under pressure in a vacuum or at reduced pressure in the vacuum chamber such that the area of the pressure sticking is gradually increased from the central portion of the base plate to the peripheral portion thereof, the film and the plate are stuck to each other under pressure without leaving air bubbles between the film and the plate and without wrinkling the film.

BRIEF DESCRIPTION OF THE DRAWINGS

FIGS. 8A, 8B and 8C are sectional views illustrating the pressure adhering steps of the dry film sticking method.

FIG. 9 shows a sectional view of a stratified body made of a dry film, a base plate and a carrier stuck together under pressure in each of the apparatus and the method.

Figure 1:
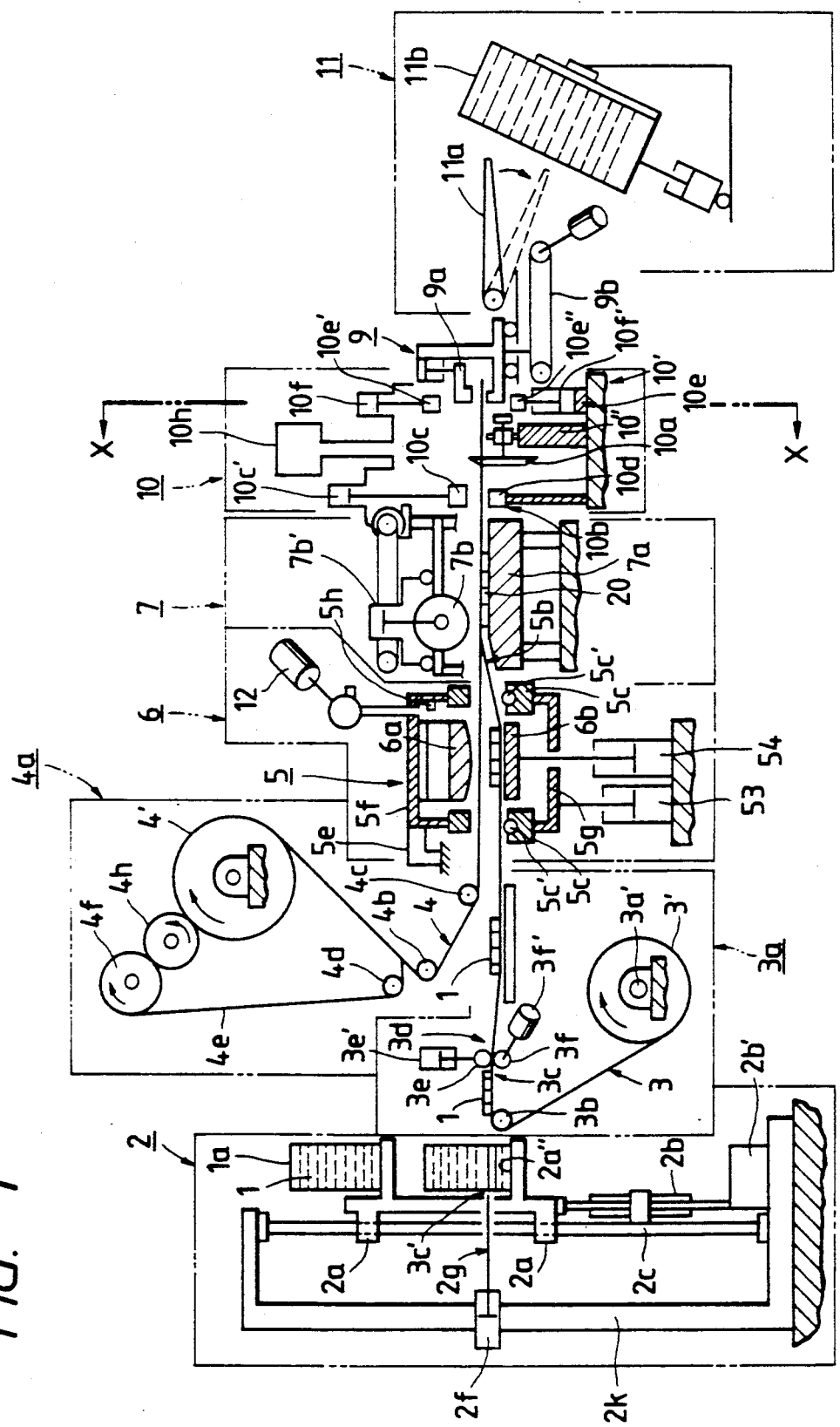
FIG. 1 is a schematic view illustrating a dry film sticking method and a dry film sticking apparatus in accordance with preferred embodiments of the present invention.

Shown in the drawings are a base plate 1, a loader 2, carrier 3, a dry film 4, a vacuum chamber 5, a pressure sticking means 6, a posterior pressure sticking means 7, a film conveyance means 9, and a cutoff means 10.

DETAILED DESCRIPTION OF THE PREFERRED EMBODIMENTS

Embodiments of the present invention are hereafter described in detail with reference to the drawings attached hereto.

Figure 2A:
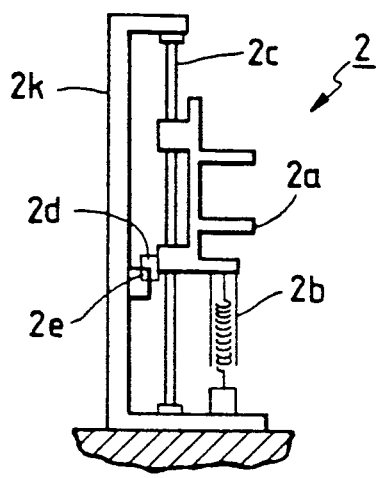
FIG. 2A is a side view of a loader of the apparatus of FIG. 1.
Figure 2B:
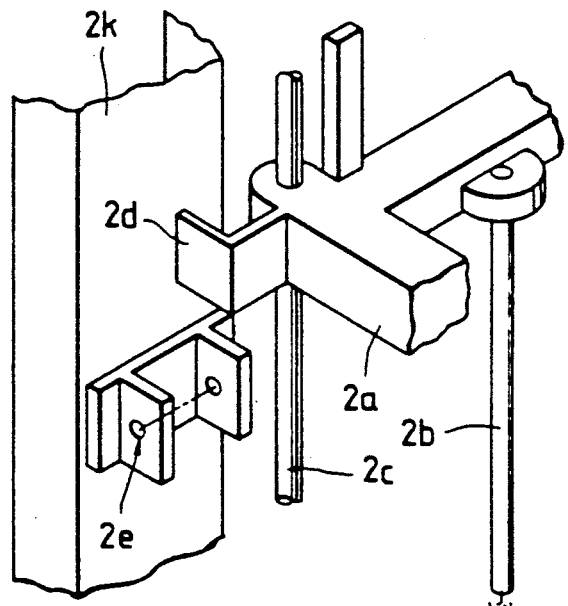
FIG. 2B is a perspective view of the loader FIG. 2A.
Figure 3A:
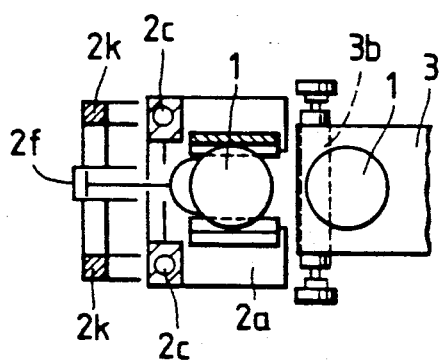
FIG. 3A is a plan view of a push-out cylinder of the apparatus of FIG. 1.
Figure 3B:
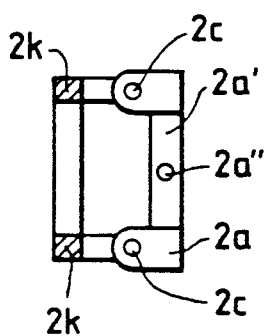
FIG. 3B is a plan view of a support arm and cassette sensor of the apparatus of FIG. 1.

FIG. 1 is a schematic view illustrating a dry film sticking method and a dry film sticking apparatus in accordance with preferred embodiments of the invention. The apparatus includes a loader 2 by which base plates 1 are transferred one after another onto a carrier 3 from a cassette 1a put on a vertically movable support arm 2a. When a cassette 1a is put on the support arm 2a, a cassette sensor 2a" provided on the top 2a' of the support arm as shown in FIG. 3B detects the cassette. The sensor 2a" is of the optical fiber type or the pressure detection type. The support arm 2a is moved up and down by a vertical mover 2b while being guided by a guide column 2c attached to a stand 2k, as shown in FIGS. 2A and 2B. The vertical mover 2b is made of a screw unit. When the cassette 1a is detected by the sensor 2a", the vertical drive motor 2b" of the vertical mover 2b is put into action. When a light blocking member 2d provided on the support arm 2a reaches a position 3c' such that the light blocking member blocks light from a position light sensor 2e attached to the stand 2k, the motor 2b' is stopped. The position 3c' is predetermined so that after the lowermost base plate 1, whose bottom is on the same plane as a carrying surface 3c, is transferred out of the cassette 1a onto the carrying surface, the height from the position 3c' to the second lowermost base plate 1 housed in the cassette 1a so as to be transferred next is detected by the cassette sensor 2a" and the vertical drive motor 2b' is then put into action to move down the second lowermost base plate to the position 3c'. Even if the base plates 1 are not housed in all the housing sections of the cassette 1a, each base plate to be transferred next can be brought to the prescribed position 3c' through the action of the cassette sensor 2a".

Figure 3C:
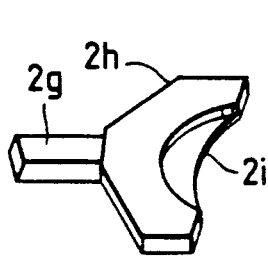
FIG. 3C is a perspective view of a base plate pushing portion of the push-out cylinder of FIG. 3A.
Figure 3D:
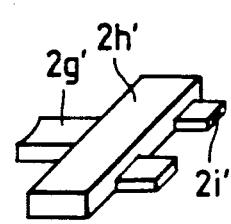
FIG. 3D is a perspective view of a modification of the base plate pushing portion of FIG. 3C.

A push-out cylinder 2f for pushing the base plate 1 onto carrying surface 3c is attached to the stand 2k at the same height as the position 3c'. FIG. 3A shows a plan view of the push-out cylinder 2f. FIG. 3B shows a plan view of the support arm 2a and the cassette sensor 2a". FIG. 3C shows a perspective view of the base plate push-out rod 2g of the push-out cylinder 2f. FIG. 3D shows a perspective view of a modification 2g' of the base plate push-out rod of the push-out cylinder 2f. Shown at 3b in FIG. 3A is a transfer roller attached to the support frame of a conveyer. The carrier 3. on which the base plate 1 is placed is supported by the rotatable roller 3b to change the direction of movement of the carrier. As for the base plate push-out rod 2g shown in FIG. 3C, a pusher 2h for pushing the base plate 1 is provided, and a tongue 2i is attached to the bottom of the pusher to support the base plate 1 at the bottom thereof when the base plate is transferred from the cassette 1a onto the carrier 3. As for the base plate push-out rod 2g' shown in FIG. 3D, a pusher 2h' is provided, and tongues 2i' are attached to the bottom of the pusher to support the base plate 1 at the bottom thereof when the base plate is transferred from the cassette 1a onto the carrier 3.

Figure 4:
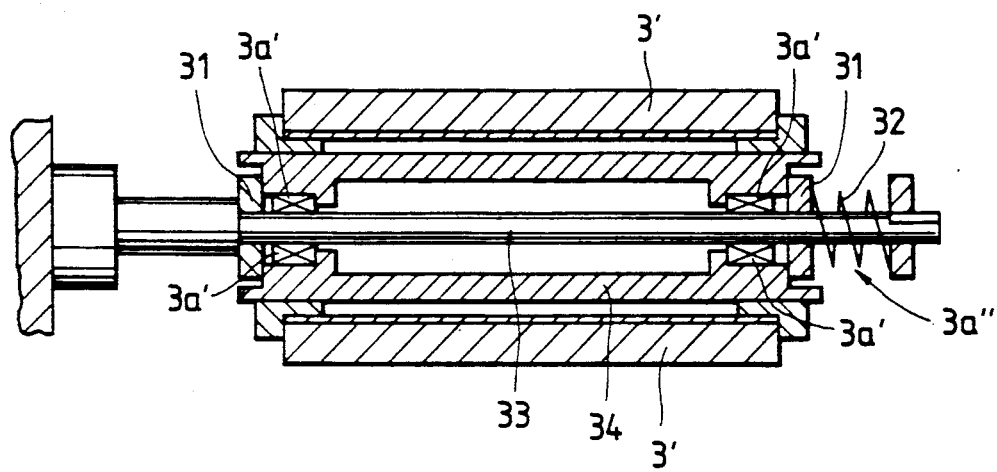
FIG. 4 is a sectional view of the vertically wound carrier support portion of the carrier feed means of the apparatus of FIG. 1.

The vertically wound carrier support portion 3a' of a carrier feed means 3a for supplying the vertically wound carrier 3' is provided with a conventional brake mechanism 3a" composed of a friction plate 31 and a spring 32 to apply to a tensile force to the carrier 3, as shown in FIG. 4. The carrier feed means 3a includes a rotary shaft 33 and a carrier winding cylinder 34.

The transfer roller 3b shown in FIG. 1 acts to change the direction of travel of the carrier 3 to move it horizontally, and also supports the base plate 1 at the time of the transfer thereof. A loosening roller unit 3d including upper and lower rollers 3e and 3f is provided as shown in FIG. 1. A pressure cylinder 3e' is provided over the upper roller 3e to pinch the carrier 3 to apply a tensile force thereto between the roller unit 3d and the carrier feed means 3a. A loosening motor 3f is rotated by such a quantity as to loosen the carrier 3 downstream of the loosening roller unit 3d.

Figure 5:
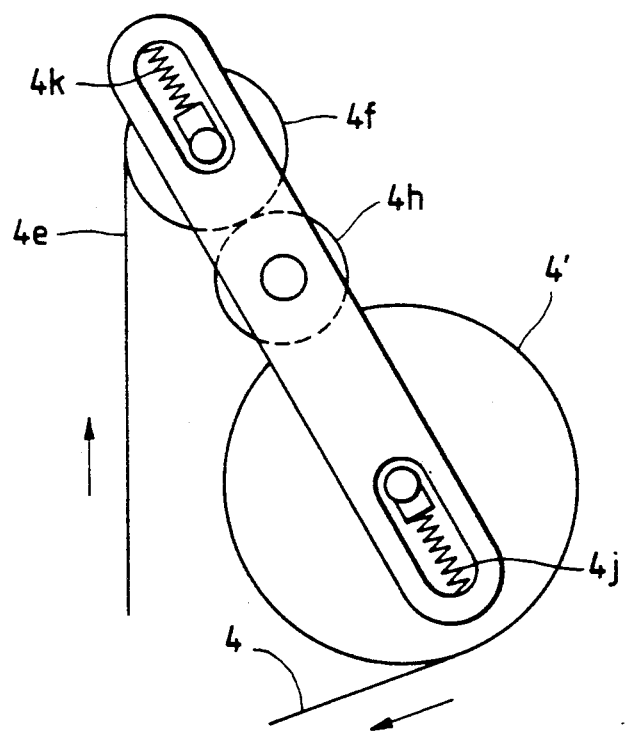
FIG. 5 is a side view of the dry film feed means of the apparatus of FIG. 1.

The vertically wound dry film support portion of a dry film feed means 4a is provided with the same kind of brake mechanism as that for the vertically wound carrier feed means 3a. As shown in FIG. 5, the peripheral surface of a cover film winding roller 4f for winding a cover film 4e is in contact with that of an idle roller 4h, which is in contact with that of a vertically wound dry film 4', so that the cover film 4e is wound on the cover film winding roller by the same length as the dry film 4 unwound from the vertically wound dry film 4'. Contact pressure keepers 4j and 4k are provided to keep the contact pressure between the rollers 4f and 4h and the wound film 4' at a prescribed level. The idle roller 4h may be eliminated. If the idle roller 4h is not provided, the peripheral surface of the cover film winding roller 4f and that of the vertically wound dry film 4' are located in contact with each other, and the direction of rotation of the roller 4f is made reverse to that in the case that the idle roller is provided.

Figure 6:
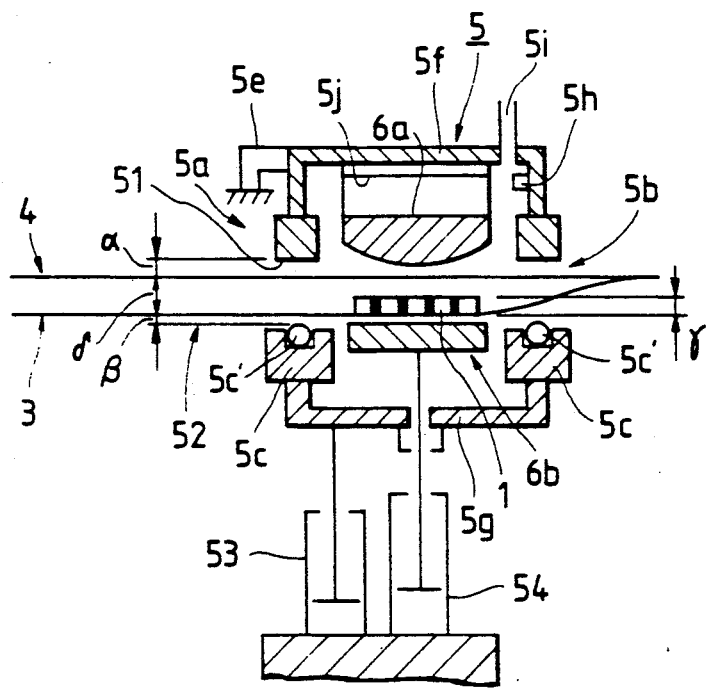
FIG. 6 is a sectional view of the vacuum chamber of the apparatus of FIG. 1.

As shown in FIG. 6, a vacuum chamber 5 is defined by an upper box 5f secured to a base 5e, and a lower box 5g which is vertically movably supported by a vertical mover 53 made of a pneumatic cylinder. The lower box 5g is provided with a sealing means 5c in contact with the upper box 5f. The sealing means 5c is made of an O-ring 5c' for keeping the vacuum chamber 5 airtight at the convey-in port 5a and convey-out port 5b thereof. When the dry film 4 and the base plate 1 are to be stuck to each other under pressure, the lower box 5g is moved up into tight contact with the upper box 5f and the pressure in the vacuum chamber 5 is reduced to a prescribed level by an air extractor 12 and detected to be reduced to that level. A pressure sensor 5h is provided in the vacuum chamber 5. The chamber 5 is provided with an air extraction port 5i. A heater 5j for setting a temperature for the pressure sticking of the dry film 4 and the base plate 1 may be provided in the vacuum chamber 5. The size of the convey-in port 5a of the vacuum chamber 5 is such that the distance between the top 51 of the port and the dry film 4 is $\alpha$, that between the bottom 52 of the port and the carrier 3 is $\beta$, and the distance between dry film 4 and carrier 3 is $\delta$ which enables the dry film and the carrier to pass through the port, as shown in FIG. 6. The thickness $\gamma$ of the base plate 1 on the carrier 3 is smaller than the distance $\delta$. For example, the distances $\alpha$, $\delta$, and $\beta$ are 0.5 mm to 1.5 mm, 5 mm to 15 mm, and 5 mm to 15 mm, respectively. The size of the outlet port 5b is the same as that of the inlet port 5a. A lower contact member 6b is vertically movably supported by a vertical mover 54 made of a pneumatic cylinder. The top of the lower contact member 6b is such a smooth surface that the carrier 3 is not damaged when the conveyed-in carrier is moved while the bottom thereof is in slip contact with the top of the lower contact member. An upper contact member 6a, whose bottom is convex downward is provided.

A conventional heat and pressure sticking roller 7b is provided adjacent the vacuum chamber outlet. A pneumatic cylinder 7b' is provided over the roller 7b to apply a prescribed downward pushing force thereto. When a stratified body 20 consisting of the base plate 1, the dry film 4 and the carrier 3 stuck together has come to a stage 7a, the plate, the film and the carrier are further stuck to each other under heat and pressure.

Figure 7:
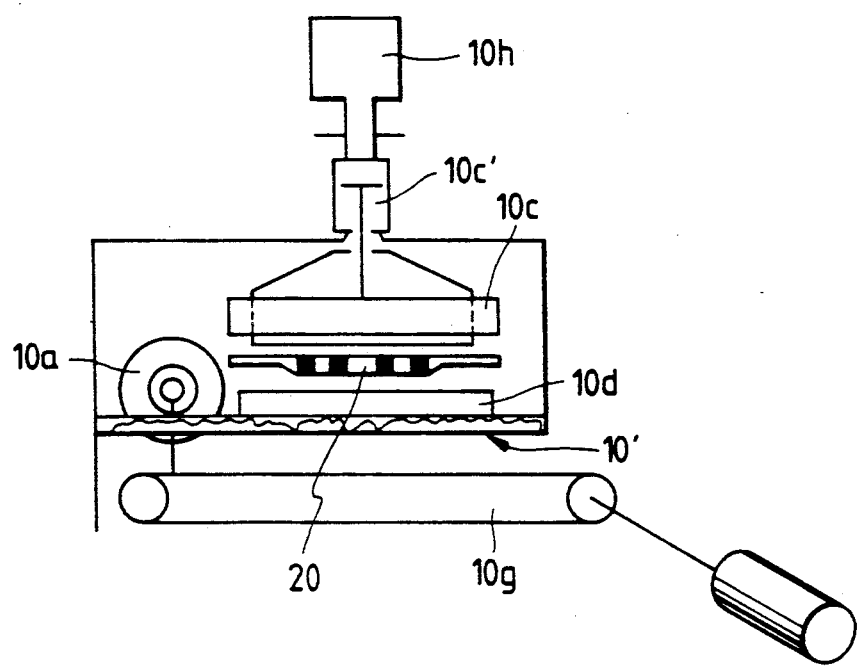
FIG. 7 is a sectional view seen along arrows X as shown in FIG. 1.

The upper holding member 10c of the upstream holder 10b of a cutoff means 10 is vertically movably supported by a pneumatic cylinder 10c'. The lower holding member 10d of the upstream holder 10b is secured to a base 10'. The upper and lower holding members 10e' and 10e" of the downstream holder 10e of the cutoff means 10 are usually in mutually opened positions at such a distance from each other that the members do not interfere with the stratified body holding member 9a of a film pull-out means 9. When the stratified body 20 is to be held, the upper and the lower holding members 10e' and 10e" are vertically closed to each other by an upper and a lower pneumatic cylinders 10f and 10f'. A rotary cutter 10a shown in FIG. 7 is moved from one side edge of the stratified body 20 to the other side edge thereof by a timing belt 10g while the body is held by the upper and the lower holding members 10e' and 10e" and the cutter is rotated through engagement with a rack 10" attached to the base 10', so that the dry film 4 of the body is cut off at the upstream end of the stratified body 20. As shown in FIG. 1, the cutoff means 10 includes a suction unit 10h for removing air from the space surrounded by the upstream and the downstream holders 10b and 10e, so that a chip made from the stratified body 20 in cutting off the dry film 4 thereof is prevented from flying away.

The stratified body 20 having the dry film 4 cut off by the cutter 10a is held by the holding member 9a of the film pull-out means 9 which is moved by a timing belt 9b so that the stratified body is conveyed out to an unloader 11 and put into a cassette 11b through an outlet chute 11a.

The tension of the dry film 4 is maintained between a tension roller 4c and the upstream holder 10b. However, when the upper and lower holding members 10c and 10d of the upstream holder 10b are vertically opened from each other, the stratified body 20 is held by the holding member 9a instead of the upstream holder and the dry film 4 is pulled out from the vertically wound dry film 4' by the movement of the film pull-out means so that the tension of the film 4 is maintained.

The dry film sticking method will now be described in detail with reference to the drawings. The support arm 2a of a loader 2 is moved up and down by a vertical mover 2b while being guided on a guide column 2c. When a base plate 1 is thereby moved to the same height as the carrying surface 3c of a carrier 3, a light blocking member 2d is detected by a position light sensor 2e to stop the vertical movement of the support arm 2a, and the lowermost base plate 1 is transferred from a cassette 1a onto the carrying surface 3c of the carrier 3. As shown in FIG. 3C, the front portion of a push-out rod 2g consists of a pusher 2h and a tongue 2i so that the base plate 1, which would become unstable due to the displacement of the center of gravity thereof in being transferred from the cassette 1a onto the carrier 3, is supported by the tongue and thereby securely transferred from the cassette onto the carrier. A carrier feed means 3a is provided under the carrying surface 3c. The carrier 3 is moved into a vacuum chamber 5 along a loosening roller unit 3d including a transfer roller 3b for receiving the base plate 1 and changing the direction of travel of the carrier to move it horizontally, and a pair of rollers 3e and 3f for loosening the carrier.

A dry film feed means 4a is provided over the carrying surface 3c so that a dry film 4 coated with a cover film 4e is unwound from large roller 4' and moved in between a turn roller 4b and a cover roller 4d. The cover film 4e is peeled from the dry film 4, turned upward and taken up by a cover film winding roller 4f. The dry film 4 is moved into the vacuum chamber 5 while receiving a prescribed tensile force between a tension roller 4c and a film pull-out means 9.

As shown in FIG. 6, the height of the bottom of an upper contact member 6a is set to be equal to that of the top 51 of the inlet port 5a of the vacuum chamber 5. The height of the top of a lower contact member 6b is set to be such that the loose carrier 3 carrying the base plate 1 does not come into contact with the bottom 52 of the inlet port 5a. As a result, the base plate 1 is conveyed while the bottom of the carrier 3 slips on the smooth top of the lower contact member 6b.

The dry film 4 and the carrier 3 are moved by the movement of the film pull-out means 9. When it is detected by a sensor that the central portion of the base plate 1 has come to the central portion of the lower contact member 6b, the movement of the dry film 4 and the carrier 3 is stopped and a pair of sealing means 5c provided at the inlet port 5a and outlet port 5b are moved up to push the carrier and the dry film onto the edges at the tops 51 of the inlet and the outlet ports to seal the vacuum chamber 5. The air is then extracted from the vacuum chamber 5. When it is detected that the pressure in the vacuum chamber 5 is reduced to a prescribed level, the lower contact member 6b is moved up by an actuator 54 so that the dry film 4, the base plate 1 and the carrier 3 are stuck to each other under pressure, between the lower contact member and the upper contact member 6a.

FIG. 8A shows that the base plate 1 is stopped at the central portion of the lower contact member 6b. FIG. 8B shows that the vacuum chamber 5 is sealed by pushing the sealing means 5c onto the dry film 4 and the carrier 3 at the tops 51 of the convey-in and the convey-out ports 5a and 5b. Since the carrier 3 is loose although the air is extracted from the sealed vacuum chamber 5, the top of the base plate 1 and the dry film 4 do not come into contact with each other. FIG. 8C shows that the lower contact member 6b is moved up to push the dry film 4, the base plate 1 and the carrier 3 onto the upper contact member 6a by a prescribed lifting force to stick the film, the plate and the carrier to each other under pressure as the upper contact member is elastically deformed. Since the thickness of the central portion of the upper contact member 6a is larger than that of the peripheral portion thereof, the lower photosensitive resin layer of the dry film 4 begins to come into contact with the central portion of the base plate 1 first and then gradually comes into contact with the peripheral portion thereof as well, along with the elevation of the lower contact member 6b toward the upper contact member in the pressure sticking of the dry film and the base plate Since the dry film 4 and the base plate 1 are thus stuck to each other under pressure in the vacuum chamber at reduced pressure, starting with the central portion of the base plate, no air bubbles will be left between the photosensitive resin layer of the dry film 4 and the base plate at the time of completion of the pressure sticking thereof and the dry film will not be wrinkled as a result of the pressure sticking. The dry film 4, the base plate 1 and the carrier 3 are thus stuck to each other by a pressure sticking means 6 comprising the upper contact member 6a, the lower contact member 6b and an actuator 6c so that the dry film, the base plate and the carrier form a stratified body 20 as shown in FIG. 9. After the pressure of the vacuum chamber 5 is returned to the atmospheric level and a vertical mover 53, which acts as a sealing control means, is moved down, the stratified body 20 is moved onto a stage 7a so that the stratified body is subjected to secondary pressure sticking by the downward pressure of a heat and a pressure sticking roller 7b. If enough heat and pressure are applied to the dry film 4, the base plate 1 and the carrier 3 at the pressure sticking means 6, the heat and pressure rolling step may be avoided. Alternatively, the heating step during the step of compression in the vacuum chamber may be eliminated.

It will be appreciated that the combination of the rollers 3e and 3f, tension roller 4c and pull out means 9 maintain carrier 3 relatively loose and thin film 4 relatively tense. This insures separation of the base plate and the thin film when they enter the vacuum chamber. Also, when the vacuum chamber is sealed the seals will pinch the thin film 4 and carrier 3 thereby continuing to maintain the base plate and thin film separate from one another while the chamber is degassed. In this way the vacuum or reduced pressure will exist before the thin film first touches the base plate, insuring a better sticking of the thin film to the base plate.

When the stratified body 20 is pulled by the film pull-out means 9 from the stage 7a to the rotary cutter 10a of a cutoff means 10, the movement of the stratified body is stopped and the body is held at the cutting station thereof by upstream and downstream holders 10b and 10e. The cutter 10a is then moved to cut off the stratified body 20 at the prescribed portion thereof. After the stratified body 20 cut off as mentioned above is released from the downstream holder 10e, the body is conveyed downstream further by the film pull-out means 9. The body 20 is then released from the film pull-out means 9 and put into a cassette.

The present invention is not confined to the above-described embodiments but may be embodied or practiced in other various ways without departing from the spirit or essential character thereof.

According to the present invention a thin film and a base plate are stuck to each other under pressure in a vacuum chamber so that the area of the pressure sticking is gradually increased from the central portion of the base plate to the peripheral portion thereof. For that reason, the thin film and the base plate are stuck to each other under pressure without leaving an air bubble between the thin film and the base plate and without wrinkling the thin film.

What is claimed is:

1. In a process for producing a printed circuit, a method of pressure and heat sticking a dry, thin film to a base plate, comprising the steps of:
   (a) introducing into a vacuum chamber said thin film and said base plate at positions separated from one another by a prescribed distance and between an upper contact member and a lower contact member; said upper contact member being thicker in the center than on its peripheral portions and being made of an elastic material, and said lower contact member being flat and made of a material of higher rigidity than said base plate and said upper contact member;
   (b) sealing said film and base plate in said vacuum chamber;
   (c) reducing the pressure in said vacuum chamber to a near vacuum;
   (d) applying pressure to the combination of said thin film and base plate by moving at least one of said upper and lower contact members to cause said contact members to bring together said base plate and said thin film in a pressurized relationship whereby the thicker part of said upper contact member first comes in contact with a central portion of said thin film covering said base plate and then elastically deforms resulting in pressure first being applied to the central portion of said thin film-base plate combination and then spreading the applied pressure outward toward the periphery of said combination; and
   (e) applying heat during the step of applying pressure; further comprising the step of removing the combination thin film-base plate from said vacuum chamber and applying further pressure and heat to said combination at atmospheric pressure by means of a heating and pressure sticking roller.

2. The method of claim 1 wherein the step of applying pressure comprises vertically moving said flat lower contact member towards said base plate to push said base plate into contact with said thin film and said thin film into contact with a convex surface of said upper contact member.

3. The method of claim 2 wherein said vacuum chamber has an inlet port and an outlet port and said thin film and base plate are moved into the vacuum chamber through said inlet port and out of the vacuum chamber through said outlet port and the step of sealing comprises closing off said inlet and outlet ports.

4. The method of claim 3 further comprising providing said base plate on a film-like carrier as it is introduced into said vacuum chamber such that said thin film and said carrier are overlaid one above the other in noncontacting relationship, said carrier being sufficiently loose so as not to hinder the carrying of said base plate; applying a tensile force to said thin film as it is introduced into said vacuum chamber.

5. The method of claim 4 wherein said base plate comprises a semiconductor substrate and said thin film is a layered combination comprising a layer of light transmissible resin film overlaying a layer of photosensitive resin.

6. Apparatus for automatically pressure and heat sticking a dry, thin film to a base plate, the apparatus comprising:
a vacuum chamber having an inlet and outlet for conveying said thin film and said base plate separately into and combined out of said chamber upper and lower contact members within said chamber and means to position said thin film and said base plate between said upper and lower contact members in the order of upper contact member, thin film base plate and lower contact member; said upper contact member having an elastically deformable convex surface facing said thin film; said lower contact member being rigid and having a flat surface; means for degassing said chamber to create a vacuum or near vacuum; means for moving said lower contact member in a direction to cause said thin film and base plate to be pressure sandwiched between said upper and lower base plates whereby said upper contact member s elastic convex surface deforms thereby causing pressure to be applied to said thin film-base plate combination initially at a center portion thereof and spreading outwardly therefrom to cause said thin film to adhere to said base plate; means for heating said thin film and base plate while in said vacuum during pressurization by said contact members and a heat a pressure sticking roller means, outside said chamber, for applying heat to the combination thin film and base plate in an atmospheric pressure environment.

7. Apparatus according to claim 6, wherein said means for heating comprises a heater provided at least in said upper contact member of said vacuum chamber to heat said member at a prescribed temperature to stick the thin film and the base plate to each other under pressure.

8. Apparatus according to claim 6 further comprising a film-like carrier for carrying said base plate; a holder means for holding said thin film and a film-like carrier in such a manner that one end of said film and one end of said carrier are overlaid on each other; a tension roller for applying a tensile force to said film: a loosening roller for providing said carrier with such looseness as not to hinder the carrying of said base plate put on said carrier; a sealing means for hermetically closing said inlet and outlet of said vacuum chamber after said film and said carrier with said plate put thereon are conveyed into said chamber; and a means for keeping the prescribed distance between said film and said plate in said chamber until pressure is applied.

9. Apparatus according to claim 7 further comprising a film-like carrier for carrying said base plate; a holder means for holding said thin film and a film-like carrier in such a manner that one end of said film and one end of said carrier are overlaid on each other; a tension roller for applying a tensile force to said film; a loosening roller for providing said carrier with such looseness as not to hinder the carrying of said base plate put on said carrier; a sealing means for hermetically closing said inlet and outlet of said vacuum chamber after said film and said carrier with said plate put thereon are conveyed into said chamber; and a means for keeping the prescribed distance between said film and said plate in said chamber until pressure is applied.

10. Apparatus as claimed in claim 6 wherein said base plate is comprised of a semiconductor substrate and said thin film is comprised of a layer of light transmissible resin film on a layer of photosensitive resin film.

11. Apparatus for automatically pressure and heat sticking a dry, thin film to base plates, the apparatus comprising:
a base plate loader for loading base plates from a base plate cassette into a moving film-like carrier;
carrier supply means for supplying a film-like carrier to carry said base plates;
thin film supply means for supplying continuous thin film for sticking to said base plates;
pulling means for pulling said carrier and said thin film to cause said thin film, said carrier, and said base plates to move through several operating stations;
a vacuum chamber operating station through which said thin film, said carrier and said base plates move and at which a stratified body of thin film, carrier and base plate are stuck together by pressure and heat under vacuum or near vacuum conditions; a vacuum chamber at said vacuum station having inlet and outlet ports; upper and lower contact members in said vacuum chamber; said upper contact member having a larger thickness at a central portion thereof to result in a downward facing convex surface of elasticity; said lower contact member having a flat shape and being made of a material having a higher hardness than said upper contact member; said lower contact member movably positioned in said chamber to move in a direction to compress said carrier, base plate and thin film between said upper and lower contact members; holding means for holding said thin film and said base plate at a prescribed distance from each other prior to compressing same; means for degassing said chamber to generate a reduced pressure therein; means for heating said thin film and base plate to a prescribed temperature; means for causing upward movement of said lower contact member to pinch said film, base plate, and carrier between said upper and lower members at a prescribed force to cause them to stick together and form a stratified body;

said pulling means comprising stratified body pull out means for pulling out said body from said chamber while holding one end of said body;

film cut off means provided generally between said vacuum chamber and said pulling means; and an unloader for loading said stratified body into a cassette; further comprising a heat and pressure sticking roller for sticking the components of the stratified body to each other, under heat and pressure, in an environment of air at atmospheric pressure; said roller being provided between said vacuum chamber and said film cutoff means.

12. Apparatus according to claim 11, further comprising a holder for holding said thin film and said film-like carrier in such a manner that one end of said film and one end of said carrier are overlaid one above the other in noncontacting relationship; a tension roller for applying a tensile force to said film; a loosening roller for providing said carrier with such looseness as not to hinder the carrying of said base plate put on said carrier; a sealing means for hermetically closing said inlet and outlet ports of the vacuum chamber after said film and said carrier with said plate thereon are conveyed into said chamber; and a means for maintaining the prescribed distance between said film and said plate in said chamber when said inlet and outlet ports are hermetically closed.

13. Apparatus for automatically pressure and heat sticking a dry, thin film to base plates, the apparatus comprising:

a base plate loader for loading base plates from a base plate cassette into a moving film-like carrier;

carrier supply means for supplying a film-like carrier to carry said base plates;

thin film supply means for supplying continuous thin film for sticking to said base plates;

pulling means for pulling said carrier and said thin film to cause said thin film, said carrier, and said base plates to move through several operating stations;

a vacuum chamber operating station through which said thin film, said carrier and said base plates move and at which a stratified body of thin film, carrier and base plate are stuck together by pressure and heat under vacuum or near vacuum conditions; a vacuum chamber at said vacuum station having inlet and outlet ports; upper and lower contact members in said vacuum chamber; said upper contact member having a larger thickness at a central portion thereof to result in a downward facing convex surface of elasticity; said lower contact member having a flat shape and being made of a material having as higher hardness than said upper contact member; said lower contact member movably positioned in said chamber to move in a direction to compress said carrier, base plate and thin film between said upper and lower contact members; holding means for holding said thin film and said base plate at a prescribed distance from each other prior to compressing same; means for degassing said chamber to generate a reduced pressure therein; means for heating said thin film and base plate to a prescribed temperature; means for causing upward movement of said lower contact member to pinch said film, base plate, and carrier between said upper and lower members at a prescribed force to cause them to stick together and form a stratified body;

said pulling means comprising stratified body pull out means for pulling out said body from said chamber while holding one end of said body;

film cut off means provided generally between said vacuum chamber and said pulling means; and an unloader for loading said stratified body into a cassette;

wherein said heating means comprises a heater provided on said upper contact member to stick the thin film to the base plate, under pressure, at a prescribed temperature; and further comprising a heat and pressure sticking roller for sticking the components of the stratified body to each other, under heat and pressure, in an environment of air at atmospheric pressure; said roller being provided between said vacuum chamber and said film cutoff means.

14. Apparatus according to claim 13, further comprising a holder for holding said thin film and said film-like carrier in such a manner that one end of said film and one end of said carrier are overlaid one above the other in noncontacting relationship; a tension roller for applying a tensile force to said film; a loosening roller for providing said carrier with such looseness as not to hinder the carrying of said base plate put on said carrier; a sealing means for hermetically closing said inlet and outlet ports of the vacuum chamber after said film and said carrier with said plate thereon are conveyed into said chamber; and a means for maintaining the prescribed distance between said film and said plate in said chamber when said inlet and outlet ports are hermetically closed.

15. In an automated process for producing a plurality of printed circuits a method for adhering a dry, thin film to flat base plates thru the application of pressure thereto, the improvement comprising, mechanically applying pressure to a dry thin film and a base plate in reduced pressure atmosphere of a vacuum chamber in accordance with a sequence of contact pressure being applied to the thin film-base plate combination starting at the center of the base plate and moving outward to the peripheral portions thereof;

further comprising the subsequent step of applying further heat and compressive pressure to the combination thin film-base plate in an environment at atmospheric pressure.

16. The method of claim 15 wherein said base plate comprises a semiconductor substrate and said thin film comprises a laminate of a light transmissible resin film overlaying a photosensitive resin film.

17. In an automated process for producing a plurality of printed circuits a method for adhering a dry, thin film to flat base plates thru the application of pressure thereto, the improvement comprising, mechanically applying pressure to a dry thin film and a base plate in reduced pressure atmosphere of a vacuum chamber in accordance with a sequence of contact pressure being applied to the thin film-base plate combination starting at the center of the base plate and moving outward to the peripheral portions thereof;

further comprising the step of applying heat in the vacuum chamber at the time of applying pressure; and the subsequent step of applying further heat and compressive pressure to the combination thin film-base plate in an environment at atmospheric pressure.

18. The method of claim 17 wherein said base plate comprises a semiconductor substrate and said thin film comprises a laminate of a light transmissible resin film overlaying a photosensitive resin film.

* * * * *